United States Patent [19]
Hyde

[11] 3,931,569
[45] Jan. 6, 1976

[54] NARROW CAVITY LOW COST EPR SPECTROMETER

[75] Inventor: James S. Hyde, Menlo Park, Calif.

[73] Assignee: Varian Associates, Palo Alto, Calif.

[22] Filed: Feb. 19, 1974

[21] Appl. No.: 443,542

[52] U.S. Cl. .................. 324/0.5 A; 324/0.5 AH
[51] Int. Cl.² .................................. G01R 33/08
[58] Field of Search ........ 324/0.5 R, 0.5 A, 0.5 AC, 324/0.5 AH

[56] References Cited
UNITED STATES PATENTS

| | | | |
|---|---|---|---|
| 3,072,890 | 1/1963 | Smith et al. | 324/0.5 AH |
| 3,100,280 | 8/1963 | Hyde | 324/0.5 A |
| 3,582,778 | 6/1971 | Faulkner | 324/0.5 AH |
| 3,701,959 | 10/1972 | Hansen | 324/0.5 AH |

OTHER PUBLICATIONS

J. S. Hyde—A new Principle for Aqueous Sample Cells for EPR—Review of Scientific Instruments—43(4)—Apr. 1972—pp. 629–631.

*Primary Examiner*—R. V. Rolinec
*Assistant Examiner*—Michael J. Tokar
*Attorney, Agent, or Firm*—Stanley Z. Cole; Gerald M. Fisher

[57] ABSTRACT

An EPR spectrometer of high sensitivity and low cost particularly adapted for studying liquid samples of high dielectric loss such as water. A microwave cavity is employed oscillating either in the rectangular $TE_{10n}$ or cylindrical $TM_{lm0}$ mode, where $l$, $m$, and $n$ are integers. The cavity dimension corresponding to zero index is small, of the order of 2 mm for a spectrometer operating at 10 GHz, resulting in (1) the cavity frequency is unchanged (2) the cavity Q is unusually low (3) the cavity filling factor for 1 mm inner diameter cylindrical sample tubes is unusually high. The product of the Q and the filling factor, which product determines the EPR sensitivity, is as high a value as is found in larger high Q cavities. The requisite magnet gap is unusually small, thus greatly lowering the weight and cost of the magnet required. Rather noisy inexpensive low quality microwave sources can be used without degradation in sensitivity because of the low Q. Low Q lessens demodulation of microwave oscillator FM noise or enhancement of AM noise. An alternative aqueous cell of flat cuvette shape can be used oriented perpendicular to the cavity dimension corresponding to the zero index yielding improved sensitivity.

19 Claims, 11 Drawing Figures

NARROW CAVITY LOW COST EPR SPECTROMETER

BACKGROUND OF THE INVENTION

Prior art research-type EPR spectrometers have generally included a high Q resonant cavity excited by a high quality, relatively noise-free source. A high Q cavity requires a high cavity volume to cavity wall surface ratio, which in turn necessitates a relatively large volume of polarizing magnetic field, thereby requiring a large magnet weighing 1000 kg or more. Heretofore these spectrometers have been designed to obtain a flexible instrument of high sensitivity for a wide variety of samples in a wide variety of applications. This objective has resulted in research-type equipment which is generally considered very expensive.

There are three types of aqueous sample cell geometries that have been used in the past for EPR experiments. In many different cavities at a frequency of 10 GHz a capillary of about 1 mm diameter has proven to be optimum when operating within the constraint that it is desirable to use a cylindrical tube to contain the sample. 1 mm capillaries are furthermore convenient because they are readily available, inexpensive, and precise in size, permitting accurate quantitative measurements. A second type, the so-called flat cell, is described by L. G. Stoodley, J. Electronics and Control, 14, 531 (1963).

Stoodley analyzes a rectangular $TE_{102}$ cavity having a nodal plane of zero microwave electric field and maximum microwave magnetic field considering the aqueous sample to be a slab coincident with this plane but of finite thickness extending slightly into regions of finite electric field intensity.

A third type of cell has been described by J. S. Hyde, Rev. Sci. Instru., 43, 629 (1972). Hyde shows that samples with high dielectric loss can be inserted into regions of high microwave electric field intensity providing that the electric field vectors are perpendicular to the surface of the cell. Polarization charges on the surface of the cell tend to prevent the electric field from penetrating the sample.

SUMMARY OF THE INVENTION

In accordance with the present invention there is described an EPR spectrometer designed from the point of view of arriving at a high sensitivity instrument for examining aqueous samples or other liquid samples of relatively high dielectric loss at room temperature. This invention has provided sensitive, low-cost apparatus for this restricted range of applications.

This invention is directed particularly to EPR spectrometers utilizing rectangular $TE_{102}$ or cylindrical $TM_{110}$ modes, although it can be extended readily to $TE_{l0n}$ or $TM_{lm0}$ modes where l, n, and m are any integers, and to other modes as well. As is well known, the polarizing magnetic field for electron paramagnetic resonance is parallel to the cavity dimension that corresponds to the zero index, and the magnitude of this cavity dimension does not affect the resonant frequency of the cavity. In accordance with the present invention the cavity dimension corresponding to the zero index is made small, of the order of the outer diameter of the optimum capillary sample tube outer diameter, i.e., 2 mm if the inner diameter is 1 mm, for apparatus designed to operate at 10 GHz. It has been found that the sensitivity of the apparatus of this invention is as high as or somewhat higher than that obtained from high Q cavities of conventional design where the dimension corresponding to the zero index is typically 15 mm at 10 GHz.

This apparently surprising result can be understood when one recognizes that the Q of a cavity is approximately proportional to the dimension corresponding to the zero index and that the sensitivity is proportional to the product of the filling factor U and the cavity Q. Moreover, if the sample tube diameter is held constant it can be shown that the filling factor U is inversely proportional to the dimension corresponding to the zero index. Thus the product UQ is independent of this cavity dimension.

In further accordance with the present invention the polarizing magnet, either an electromagnet or a permanent magnet, that is employed is very much smaller than magnets heretofore required; for example, the magnet gap in one apparatus constructed according to this invention has a gap of 1 cm and a weight of 10 kg. This is to be compared with the conventional magnet for EPR. The conventional magnet for the same 3300 gauss field has a gap of 10 cm and a weight of 1000 kg. In design of magnets for magnetic resonance the following design criteria must be considered. The homogeneity of the magnetic field for a fixed magnet pole piece diameter and fixed field improves as the magnet gap is decreased. For a fixed number of ampere turns exciting an electromagnet, the strength of the magnetic field in the magnet gap increases as the gap is decreased. Likewise, for a fixed magnetic field the required number of ampere turns decreases as the gap decreases. For a smaller number of ampere turns the amount of iron required in the magnet yoke in order to avoid magnetic saturation of the iron is smaller. An approximate rule of thumb is that the weight of a magnet of constant pole piece diameter and constant magnetic field intensity varies in proportion to the third power of the magnet gap. Generally, these statements can also be made for a permanent magnet.

In further accordance with the present invention it is possible and advantageous in the EPR spectrometer of this invention to utilize a microwave source of relatively low quality and high noise with commensurate low cost, such as a Gunn semiconductor oscillator. In the prior EPR spectrometers it has generally been the practice to employ cavities having unloaded Qs on the order of 7000. In constrast, the unloaded Q of the smaller cavity of the present invention is on the order of 1000. The noise associated with a microwave source may be divided into AM and FM noise. When FM noise is incident on a highly reactive microwave element such as a high Q resonant cavity it is demodulated and lowers the sensitivity of equipment employing such elements. This noise effect has been analyzed by Feher, Bell Systems Tech. J., March 1957. Under appropriate approximations, solutions of the equation shown there indicate that the demodulated noise varies as the square of the cavity Q. In addition, it is shown in the book Electron Spin Resonance Spectrometers by T. H. Wilmshurst, Adam Hilger Ltd., London (1967), p 86, that AM noise is also enhanced by a high Q cavity. In other words, a low Q cavity introduces less distortions due to deviations from pure sinusoidal waveform of the excitation. By utilizing the smaller dimensional cavity having a lower Q, as described here among the other advantages, substantial decrease in the quality of the microwave source and therefore in the cost of the microwave source is permissible without a corresponding increase in the spectrometer noise characteristics.

Although the use of 1 mm capillaries for EPR studies has great practical convenience, it is desirable on occasion to use more specialized cells to achieve higher sensitivity. Prior art flat cells that constrain the sample to the nodal surface in $TM_{110}$ and $TE_{102}$ cavities are of no benefit in the small cavity spectrometer described in the present invention because the sensitivity increases approximately as the square root of the dimension that corresponds to zero index. However, a further feature of the present invention is that an aqueous sample cell operating on the principle enunciated by Hyde and cited above can be used. Thus a flat cell so oriented that its plane is perpendicular to the lines of microwave electric field and also perpendicular to the lines of polarizing magnetic field is consistent with the design of the spectrometer of this invention and permits an increase in sensitivity expressed in moles of paramagnetic species per liter of water (molarity) relative to the optimum cylindrical capillary of about a factor of 2.5.

It is, accordingly, an object of the present invention to provide a new and improved EPR spectrometer.

Another object of the invention is to provide an EPR spectrometer employing a relatively small, lightweight, inexpensive magnet by virtue of its having a relatively small air gap in which the spectrometer resonant cavity is located.

Another object of the invention is to provide an EPR spectrometer having desirable characteristics although driven by a microwave source of relatively poor quality with considerable noise.

A further object of the invention is to provide a new and improved EPR spectrometer which can be driven by a semiconductor microwave oscillation source, such as a Gunn oscillator.

A further object of the invention is to provide an EPR spectrometer in which a relatively large amplitude signal can be derived even though the spectrometer includes a resonant cavity having a relatively low Q.

A further object of the invention is to provide an EPR spectrometer employing a relatively low Q resonant cavity in combination with a sample holder that is particularly designed to enable the electric field vector of the cavity to intercept a large planar area of the sample at substantially right angles.

A further object of the invention is to provide an EPR spectrometer having a relatively low Q resonant cavity and a relatively large filling factor.

The above and still further objects, features and advantages of the present invention will become apparent upon consideration of the following detailed description of several specific embodiments thereof, especially when taken in conjunction with the accompanying drawing.

DETAILED DESCRIPTION OF THE DRAWING

Figure 1:
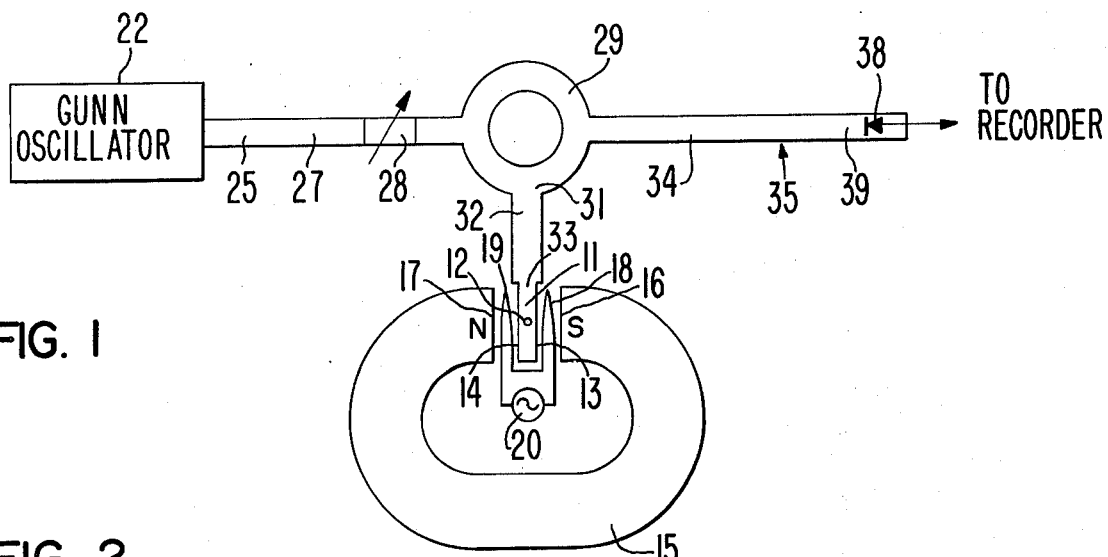
FIG. 1 is a schematic diagram of the present invention.

Reference is now made to FIG. 1 of the drawing wherein there is illustrated a microwave resonant cavity 11 that has inserted therein a hollow low loss dielectric sample holder 12. Sample holder 12 preferably contains a high loss dielectric liquid sample to be analyzed by EPR spectroscopy techniques. As discussed infra, sample 12 may take many configurations and orientations within resonant cavity 11.

Resonant cavity 11 has a relatively low Q, a result achieved by providing the cavity with a pair of parallel side walls 13 and 14 that are spaced from each other by a distance considerably less than a quarter wavelength of the energizing frequency for the cavity; typically, the separation between parallel walls 13 and 14 is on the order of 1/10 of a wavelength of the energizing microwave frequency for cavity 11. Walls 13 and 14 are positioned and the cavity 11 is excited in such a way that microwave electric field vectors extend in a direction at right angles to the walls and therefore extend between the walls.

Extending in the same direction as the microwave electric field within resonant cavity 11 is flux from a relatively strong magnetic field that includes a dc component on which is imposed a small ac component. The DC magnetic field is established by permanent magnet 15 having pole faces 16 and 17 that lie in planes parallel to cavity walls 13 and 14. Because of the small distance between parallel walls 13 and 14, there is a relatively small gap between pole faces 16 and 17, thereby considerably enabling the size and weight of magnet 15 to be reduced. The AC magnetic field component is provided by coils 18 and 19, respectively, positioned between pole face 16 and wall 13 and between wall 14 and pole face 17. Coils 18 and 19 are connected to AC source 20, which typically has a frequency on the order of 100 KHz.

Microwave energy is coupled to cavity 11 from microwave source 22 that drives homodyne fm detector bridge 23. Source 22 can be a relatively noisy microwave source, such as derived from a semiconductor oscillator, of the Gunn oscillator type. Varian Associates, a manufacturer of klystrons, Gunn diodes and also EPR spectrometers, finds that typical Gunn diodes show an FM noise between 10–50 Hz rms, normally about 20 Hz rms in a 1 KHz bandwidth 10 KHz from the carrier. (Technical data from Varian Associates, Solid State West, on VSX-9001 Solid State Oscillator, Bulletin 3012, August 1973.) Two-cavity klystrons specified for EPR spectrometers can exhibit FM noise as low as 0.1 Hz rms in a 1 KHz bandwidth 10 KHz from the carrier, but normally have noise between 0.3 to 0.6 Hz rms in this band (See "Noise Spectrum Characteristics of Low-Noise Microwave Tubes and Solid State Oscillators" by S. L. Johnson, B. H. Smith and D. A. Calder, Proc. IEEE, 54, 258, 1966.) External cavity low noise reflex klystrons of the type previously used for EPR spectrometers exhibit more FM noise than two-cavity klystrons, as between 6 and 10 Hz rms in the same band, but their noise characteristic is generally better than FM noise from Gunn diodes. Hand-picked Gunn diodes can be found which exhibit the same FM noise specifications as poor quality reflex klystrons but generally off the shelf items can be expected to show a difference of a factor of about 3. Klystron AM noise is similarly known to be much better than available from semiconductor oscillators. For purposes of this application, RF sources having a noise spectrum equal to or comparable to a Gunn oscillator are preferably used.

In one embodiment the Gunn oscillator is operated at a frequency of 9.4 GHz. Surprisingly, the use of a homodyne bridge 23 in combination with the relatively low Q resonant cavity 11 and a relatively inexpensive, high noise Gunn oscillator results in a high performance inexpensive EPR spectrometer.

Homodyne bridge 23 includes a variable microwave attenuator 28 that drives a three port circulator 29. An intermediate port 31 of circulator 29 is connected to waveguide 32 that excites cavity 11 through adjustable iris 33 that controls the match of waveguide 32 to cavity 11. The microwave attenuator 28 is preferably adjusted so that the liquid in sample holder 12 is driven to the "brink of saturation." However, in certain instances the microwave attenuator can be adjusted so that the sample being analyzed is driven to saturation, while in other arrangements the sample can be excited by the microwave source so that it is unsaturated and not particularly close to saturation.

Energy reflected from cavity 11 is coupled back through iris 33 and waveguide 32 to circulator 29 and thence to output arm 34 of the circulator. The energy in output arm 34 is detected by diode detector 38 in output arm 34. The signal derived from diode 38 is fed to a suitable output device, such as a chart recorder. A slight mismatch of variable iris 33 provides a microwave reference signal at diode detector 38, or a separate reference arm could be employed. As is well known to those skilled in the art, when resonance occurs in the sample of holder 12, energy is reflected from cavity 11, thereby unbalancing bridge 23 and providing a finite output from diode detector 38.

In an embodiment of the invention actually constructed, a Gunn oscillator having a frequency of 9.4 GHz was employed to excite cavity 11 to the cylindrical $TM_{110}$ mode. The cavity had the usual diameter for this mode, approximately 1.5 inch, and a thickness between parallel walls 53 and 54 of approximately 1/10 of a wavelength, approximately 0.150 inch. The gap between the pole faces 16 and 17 was approximately 0.375 inch with a resulting weight of permanent magnet 15 of approximately 15 lbs. In conventional prior art rectangular configurations, the distance between parallel walls 13 and 14 is on the order of ⅛ wavelength, approximately 0.4 inch, and the gap between pole faces 16 and 17 is in excess of 1.75 inch, requiring a magnet weight in excess of 200 lbs.

Figure 5:
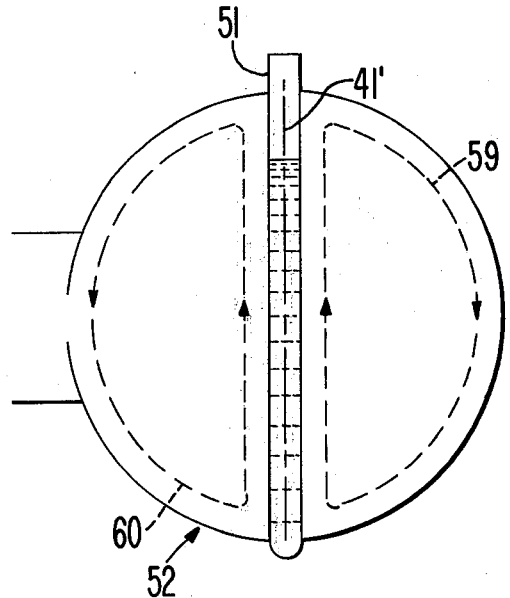
FIGS. 4 and 5 are side and top views of an EPR spectrometer cylindrical resonant cavity excited to the cylindrical $TM_{110}$ mode and carrying a cylindrical sample holder.
Figure 4:
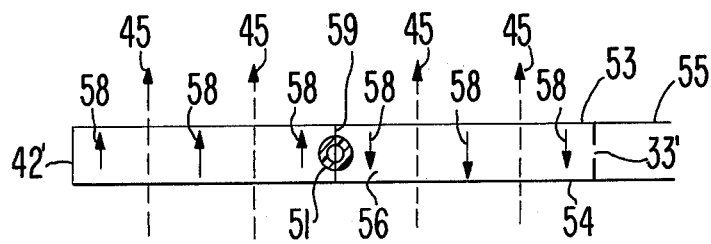

With reference to FIGS. 4 and 5, excitation of resonant cavity 11 to the cylindrical $TM_{110}$ mode results in electric field vectors 58 extending between and at right angles to relatively closely spaced cavity walls 53 and 54. A null electric field vector exists along median plane 59 of cavity 11, midway between iris 33' and cavity wall 42'. On opposite sides of median plane 59 finite, non-zero symmetrical, oppositely polarized electric field vectors 58 extend. The magnitude of the electric field vectors progressively increases from the median plane 59 to a maximum value that subsists approximately halfway between the median plane and each of iris 33' and end wall 42'. At iris 33' and end wall 42' the electric field vector is substantially a null. Extending in the same direction as the electric field vectors 58 is flux 45 from the low frequency magnetic field established by permanent magnet 15 and the magnetic field established by coils 18 and 19. The microwave magnetic field within resonant cavity 11 includes two sets of flux paths 59 and 60 that are symmetrical with median plane 59 as illustrated in FIG. 5. Flux paths 59 and 60 are polarized in the same direction but extend in opposite directions in planes at right angles to the median plane 59.

Positioned equidistant from walls 53 and 54 and symmetrically with respect to median plane 59 is a low loss dielectric sample holder 51. In the embodiment of FIGS. 4 and 5, sample holder 51 is formed as a capillary tube containing a high dielectric constant lossy liquid to be analyzed. In one particular device actually constructed the sample holder is a 1 mm diameter capillary tube which finds particular utility in certain applications, such as analysis of urine for morphine.

Figure 2:
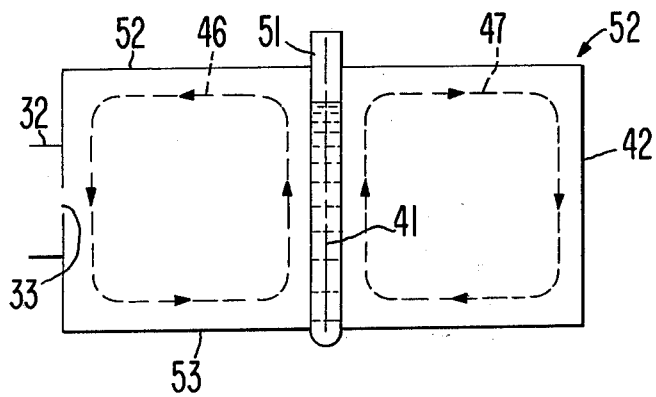
FIGS. 2 and 3 are top and side views of an EPR spectrometer rectangular resonant cavity excited to the rectangular $TE_{102}$ mode and carrying a cylindrical sample holder.
Figure 3:
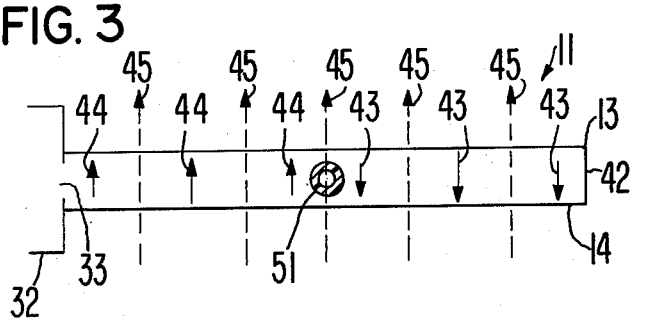

The $TM_{110}$ mode is excited in cavity 11 by providing the cavity with an iris 33' that is connected to waveguide 55 along a wall of the cavity that is parallel to end wall 42'. Substantially the same electric field pattern can be excited in a rectangular cavity 52, as illustrated in FIGS. 2 and 3, by exciting the cavity in the cylindrical $TE_{102}$ mode. Cavity 52 is dimensioned similarly to cavity 11 in that it includes relatively closely spaced parallel walls 13 and 14 which are separated from each other by approximately 1/10 of a wavelength of the microwave excitation source. Cavity 52 typically has a diameter on the order of one wavelength, approximately 1.5 inch, and is excited in response to microwave energy coupled to waveguide 32 and thence through iris 33. The $TE_{102}$ mode establishes symmetrical electric field vectors 43 and 44 on the opposite sides of median plane 41 in substantially the same manner as the electric field vectors 58 are excited in the $TM_{110}$ mode. Similarly, the magnetic field vectors 46 and 47, FIG. 2, are established in cavity 52 in substantially the same manner as the magnetic field vectors 59 and 60 are established. Cavity 52 is placed in the gap between pole faces 17 and 18 so that cavity walls 13 and 14 are parallel to the magnet pole faces, and the relatively low frequency magnetic field flux is established in cavity 52 so that it extends in a direction parallel to the microwave electric field vectors 43 and 44.

Sample holder 51 is inserted in cavity 52 in median plane 41 in the same way as the sample holder is inserted in median plane 59 in the cylindrical cavity 11. Thereby the microwave magnetic and electric fields and the low frequency magnetic field have the same effect on the sample in the cylindrical cavity as in the rectangular cavity and the same results are achieved.

Figure 6:
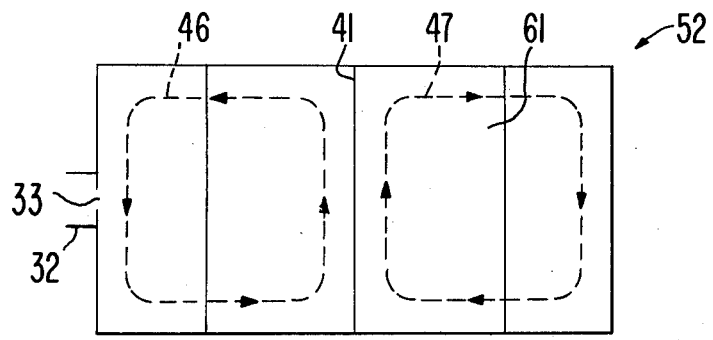
FIGS. 6 and 7 are top and side views of an EPR spectrometer rectangular resonant cavity containing a relatively thick sample holder having a substantial planar area symmetrically intercepted by oppositely polarized electric field vectors.
Figure 7:
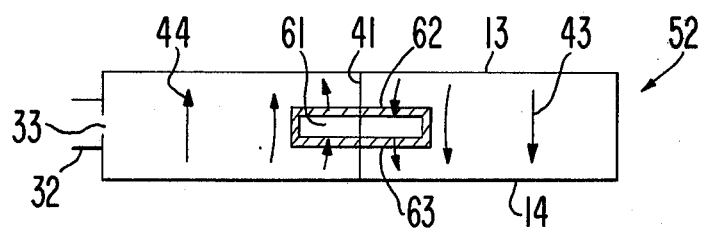

Increasing the sample volume in the resonant cavity relative to the total volume of the resonant cavity increases the filling factor and thereby provides an output signal having larger amplitude. The volume of the sample can be increased by utilizing a larger sample holder 61, as illustrated in FIGS. 6 and 7. Large sample holder 61 is a right parallelepiped symmetrically located in rectangular cavity 52 about median plane 41, with parallel faces 62 and 63 equidistant from cavity walls 13 and 14. The symmetry of hollow sample holder 61 enables the oppositely polarized electric field vectors 43 and 44 to be substantially perpendicular to a large planar area of the sample equally on either side of medial plane 41. Similarly the microwave magnetic field flux lines 46 and 47 are equal in the sample in holder 61 on either side of the medial plane 41. In a typical situation, sample cell 61 has a length parallel to walls 13 and 14 on the order of ¼ wavelength of the microwave source, approximately 0.4 inch for the described configuration.

The larger cell 61 illustrated in FIGS. 6 and 7 is at right angles to the orientation of a typical sample cell of the prior art. The longitudinal axis of the cell generally had heretofore been placed coincident with the null electric field vector, i.e., in the median plane 41 of the resonant cavity. The use of the larger sample cell of FIG. 7 having a parallelepiped configuration provides a signal having a magnitude of approximately 2.5 times that of the capillary sample holder 51 of FIGS. 2 and 3.

The cell 61 has a thickness between parallel walls 62 and 63 on the order of 0.05 λ which causes a distortion and bending of the microwave electric field vectors extending through it, see FIG. 7. Thereby, the microwave vectors are not quite perpendicular to the boundary surface of the liquid sample in cell 61 resulting in attenuation of the microwave electric field as it propagates through the sample. That component of the electric field vector that is perpendicular to the sample disposed in cell 61 is terminated by the polarization charges in the sample and tends not to penetrate the sample, but that component of the electric field vector tangent to the surface of the sample disposed in cell 61 is continuous across the sample boundary inaccordance with well-known behavior of electromagnetic field vectors, resulting in absorption of microwave power in the cavity because of dielectric loss thereby lowering the cavity Q. Said distortion increases as the sample cell thickness increases resulting in an optimum sample cell thickness of about 0.25 mm inner dimension. This optimum results from a compromise between the increase in filling factor as the cell thickness increases and the decrease in cavity Q as the cell thickness increases.

Figure 8:
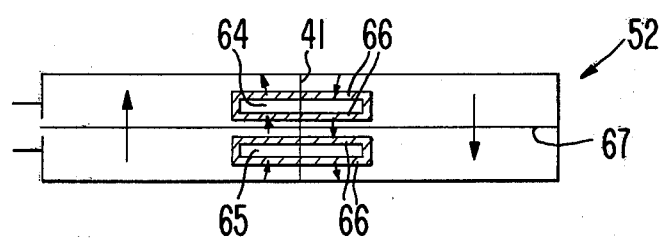
FIG. 8 is a side view of an EPR spectrometer resonant cavity containing a pair of planar, parallel sample holders.

One way to reduce the losses due to the E field distortion in connection with the thick cell 61 illustrated in FIG. 7 is to provide a cell having a pair of parallel sections 64 and 65, as illustrated in FIG. 8. Each of cells 64 and 65 is formed as a right parallelepiped having faces 66 of large area to define sample boundary surfaces, each of which is parallel to resonant cavity walls 13 and 14. Cells 64 and 65 are symmetrical about median plane 41 and a further medium plane 67 that bisects end wall 42 and extends parallel to walls 13 and 14. In tests that applicant has conducted he has found that the distortion and losses for a pair of parallel cells 64 and 65 are less than those introduced by a single cell 61 wherein the combined thicknesses of the samples in the pair of cells equal the thickness of the sample in the single cell.

The effect of parallel cells 64 and 65 can be attained by providing a single sample holder having two or more parallel enclosures that are shaped and positioned the same as cells 64 and 65. The space between the enclosures is filled by a low loss dielectric. To this end the two parallel sample holders 64 and 65 of FIG. 8 can be replaced by a single sample holder having rectangular enclosures with the same configuration as the hollow portions of holders 64 and 65. The facing inner walls of the enclosures are separated by a low loss dielectric.

The tendency for the microwave electric field vectors to be distorted at the boundary surface of the liquid sample can be compensated by bending the electric field prior to entry of the field into the sample. This result can be achieved by introducing suitable low loss dielectrics in the vicinity of the cell or by appropriately shaping the cell or the resonant cavity, as respectively illustrated in FIGS. 9 and 10.

Figure 9:
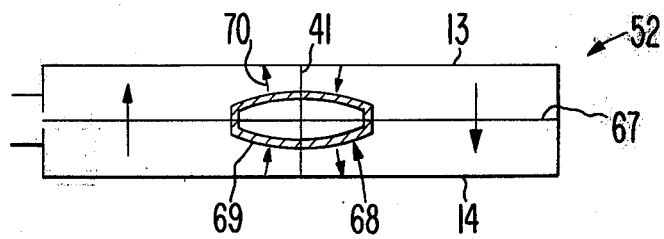
FIG. 9 is a side view of sample cell having convex sides.

In FIG. 9 the sample cell 68 is provided with a pair of opposed convex, dielectric wall 69. Walls 69 are provided with a curvature such that the electric field vectors between walls 13 and 14 intercept the cell perpendicularly so that any component of the electric field vector tangent to the surface is reduced toward zero resulting in lower dielectric losses.

Figure 10:
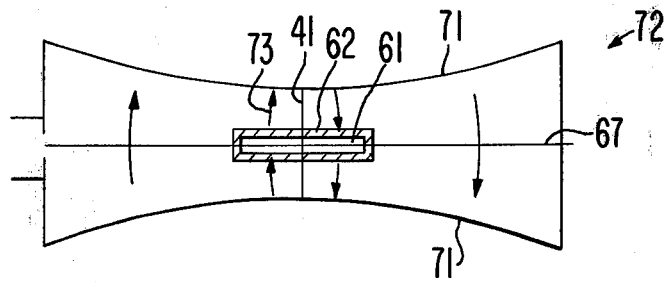
FIG. 10 is a side view of an EPR spectrometer resonant cavity having concave parallel sides.

In the embodiment of FIG. 10, opposed relatively closely spaced walls 71 of the resonant cavity are curved so that they have a concave shape whereby the electric field vectors 73 extend between the walls along curved paths. The electric field vectors 73 intercept the side walls 62 and 63 of parallelepiped sample holder 61 perpendicularly, thereby reducing microwave dielectric losses.

In the embodiments of FIGS. 9 and 10 the sample holders 61 and 69 are symmetrically located about medial planes 41 and 67 to provide the same interaction between the sample and the microwave electric and magnetic fields as is provided by the embodiment of FIGS. 6 and 7.

Figure 11:
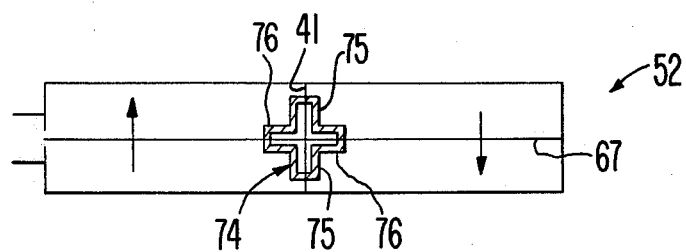
FIG. 11 is a side view of an EPR spectrometer resonant cavity containing a cross-shaped sample holder.

In accordance with a further embodiment of the invention, as illustrated in FIG. 11, a rectangular resonant cavity 11, as illustrated in the embodiments of FIGS. 2, 3 and 6–9, is employed in conjunction with a sample holder 74 having a cross configuration. Sample holder 74 includes two sets of mutually orthogonal equal length arms 75 and 76. Arms 75 are coaxial with the null electric field medial plane 41, while arms 76 are coaxial with medial plane 67. The cross configuration of FIG. 11 provides for a relatively large filling factor. The portion of the sample is disposed in arms 75 in the conventional prior art manner whereby the electric field vectors 43 and 44 intercept the sample in the arms 76 with equal amplitude but opposite polarizations.

While the embodiments of FIGS. 6-11 are illustrated as being excited in the rectangular $TE_{102}$ mode, it is to be understood that the principles of the invention are equally applicable in these embodiments to the cylindrical $TM_{110}$ excitation mode. Such excitation is provided in the manner illustrated and described in conjunction with FIGS. 4 and 5.

While there have been described and illustrated several specific embodiments of the invention it will be clear that variations in the details of the embodiments specifically illustrated and described may be made without departing from the true spirit and scope of the invention as defined in the appended claims.

What is claimed is:

1. An EPR spectrometer comprising a microwave resonant cavity, means for exciting the cavity with RF energy, said cavity being so configured that a resonant mode is established when said cavity is excited by said RF energy, said mode having a unidirectional electric field vector and at least one plane parallel to said unidirectional vector where the magnitude of said vector is zero, means for applying a polarizing, relatively steady magnetic field to the cavity in a direction parallel to said unidirectional vector, means for supporting a low loss sample holder in said cavity so that the holder has a longitudinal axis aligned perpendicular to said unidirectional vector and lies in one of said planes, said cavity and the space for the sample within the holder having approximately the same dimensions in the direction of said unidirectional vector so that there is provided a relatively high filling factor for the sample in the cavity between pole faces of the means for applying the magnetic field, said dimensions being much less than one-half of a wavelength of the RF energy exciting the cavity so that the cavity has a relatively low unloaded Q.

2. The apparatus fo claim 1 including an oscillator having a noise spectrum equal to or comparable to a Gunn oscillator as the RF source.

3. In an EPR spectrometer including a source of RF energy, a resonant cavity, said cavity being coupled to said source of RF energy and having a pair of closely spaced approximately parallel walls between which an electric microwave field vector extends in response to excitation by the RF energy source, means for providing a high DC magnetic field and a relatively low frequency magnetic field flux extending in the cavity in the same direction as the microwave electric field vector, said closely spaced walls being spaced a distance of no greater than approximately $0.25\lambda$, where $\lambda$ = microwave resonant wavelength of the cavity, said cavity having a relatively low unloaded Q of the order of 1000, an aqueous sample holder, said cavity including means to support said sample holder, said sample holder being positioned in the cavity about a median axis of the cavity so that high magnitude electric field vectors intercept the sample holder walls at right angles at substantially all points on the surface of said sample holder exposed to non-minimal electric field vectors, the interior volume of said holder substantially filling a volume of the cavity between the walls along the median axis, the means for providing a high DC magnetic field having pole faces in close proximity to the walls of the cavity.

4. The spectrometer of claim 3 wherein a sample holder including a plurality of sample enclosures is provided and each of said sample enclosures has boundary surfaces defining a substantially planar body, said holder being configured so that the samples are in parallel positions relative to each other.

5. The spectrometer of claim 3 wherein said holder is made of a selected shaped dielectric body to compensate for the tendency of the sample to distort the direction of the electric field intercepting it, at least one of said holder or cavity being shaped so that the electric field vector intersects the sample surface perpendicularly at substantially all points exposed to non-minimal electric field vector.

6. The spectrometer of claim 5 wherein said holder includes convex faces through which the electric field extends so that substantially parallel lines of the electric field pass through the sample to remove the distortion tendency.

7. The spectrometer of claim 5, said cavity having concave faces for boundaries of the electric field so that substantially parallel lines of the electric field pass through the sample to remove the distortion tendency.

8. The EPR spectrometer of claim 3 wherein said source of RF energy has an FM noise of the order of 20 Hz RMS in a 1 KHz bandwidth 10kHz from the carrier of the RF energy source.

9. The spectrometer of claim 8 wherein the source comprises a semiconductor oscillator.

10. The spectrometer of claim 9 wherein the semiconductor oscillator comprises a Gunn type oscillator, and wherein said means for providing a high DC magnetic field has a gap dimension which is of the order of $0.25\lambda$.

11. The spectrometer of claim 8 further including means for detecting the electron resonance of a sample comprising a balanced homodyne microwave detector bridge employing a single detector diode.

12. An EPR spectrometer comprising a relatively low Q microrwave resonant cavity for containing a sample to be analyzed, the unloaded Q of said cavity being of the order of 1000, a source of RF energy for exciting the cavity, said source including a semiconductor oscillator for deriving the RF excitation energy, said oscillator having a noise spectrum equal to or comparable to a Gunn oscillator, and means for polarizing the sample with a relatively steady magnetic field.

13. The spectrometer of claim 12 further including means for detecting the electron resonance of a sample, said detecting means including a homodyne microwave detector bridge having a single detector diode.

14. The EPR spectrometer of claim 1 wherein said cavity dimension is approximately $0.1\lambda$, where $\lambda$ = the wavelength of the RF energy.

15. The EPR spectrometer of claim 1 wherein said sample holder is a capillary tube.

16. The EPR spectrometer of claim 15 wherein said capillary tube has inner and outer diameters of 1 millimeter and 2 millimeters resectively, the RF energy has a frequency of the order of 10 GHz, and said dimensions are of the order of 0.150 inches so that the cavity has a Q on the order of 1000.

17. The EPR spectrometer of claim 16 wherein an aqueous sample is located in the capillary tube.

18. In an EPR spectrometer including a source of RF energy, a resonant cavity, said cavity being coupled to said source of RF energy and having a pair of closely spaced approximately parallel walls between which an electric mirowave field vector extends in response to excitation by the RF energy source, means for providing a high DC magnetic field and a relatively low frequency magnetic field flux extending in the cavity in the same direction as the microwave electric field vector, the improvement comprising, said closely spaced walls being spaced a distance of no greater than approximately $0.25\lambda$, where $\lambda$ 32 microwave resonant wavelength of the cavity, said cavity having a relatively low unloaded Q of the order of 1000, an aqueous sample holder, said cavity including means to support said sample holder, said sample holder being positioned in the cavity about the median axis so that high magnitude electric field vectors intercept the sample holder walls at right angles at substantially all points on the surface of said sample holder exposed to non-minimal electric field vectors, said holder being made of a selected shaped dielectric body to compensate for the tendency of the sample to distort the direction of the electric field intercepting it, at least one of said holder or cavity being shaped so that the electric field vector intersects the sample surface perpendicularly at substantially all points exposed to a non-minimal electric field vector, said holder comprising a cross-shaped interior cross section, said cross shape having first and second sets of mutually orthogonal arms, the first set of arms extending in a direction parallel to the direction of the electric field and positioned so that a longitudinal axis of the first set of arms is coaxial with a null plane of the electric field, the second set of arms extending on both sides of the first set of arms and being positioned in the cavity so that oppositely polarized vectors of the electric field symmetrically intercept the sample portion therein substantially at right angles.

19. The spectrometer of claim 1 wherein the cavity is configured and the frequency of exciting means are such that only one resonant mode is established in the cavity in response to excitation by said RF energy.

* * * * *

UNITED STATES PATENT OFFICE
CERTIFICATE OF CORRECTION

Patent No. 3,931,569　　　　　Dated January 6, 1976

Inventor(s) James S. Hyde

It is certified that error appears in the above-identified patent and that said Letters Patent are hereby corrected as shown below:

Column 2, line 48,　"constrast" should be -- contrast -- ;

Column 9, line 18,　"fo" should be -- of -- ;

Column 10, line 17,　"microrwave" should be "microwave" ;

Column 10, line 53,　"32" should be -- = -- .

Signed and Sealed this

Fourteenth Day of September 1976

[SEAL]

Attest:

RUTH C. MASON
*Attesting Officer*

C. MARSHALL DANN
*Commissioner of Patents and Trademarks*